United States Patent
Gore et al.

(10) Patent No.: US 6,963,481 B2
(45) Date of Patent: Nov. 8, 2005

(54) DECREASING LOAD ON DEVICES FOR MASS SPECTROMETERS

(75) Inventors: Nigel P. Gore, San Jose, CA (US); Yevgeniy N. Zhuk, Foster City, CA (US)

(73) Assignee: Thermo Finnigan LLC, San Jose, CA (US)

(*) Notice: Subject to any disclaimer, the term of this patent is extended or adjusted under 35 U.S.C. 154(b) by 15 days.

(21) Appl. No.: 10/733,167

(22) Filed: Dec. 10, 2003

(65) Prior Publication Data

US 2005/0128679 A1 Jun. 16, 2005

(51) Int. Cl.⁷ .............................. H01G 7/00
(52) U.S. Cl. ............ 361/283.1; 361/302; 361/305; 361/272; 361/277; 361/290; 174/250; 174/256
(58) Field of Search ............... 361/302, 303, 361/305, 301.1, 301.2, 272, 277, 279, 283.1, 361/289–290, 278; 174/250; 439/493, 495

(56) References Cited

U.S. PATENT DOCUMENTS

| | | | |
|---|---|---|---|
| 4,215,387 A * | 7/1980 | Negishi et al. | 361/751 |
| 6,093,054 A * | 7/2000 | Merkle et al. | 439/493 |
| 6,242,989 B1 * | 6/2001 | Barber et al. | 331/177 V |
| 6,424,515 B1 | 7/2002 | Gore et al. | |
| 6,466,447 B2 * | 10/2002 | Murowaki et al. | 361/752 |

* cited by examiner

Primary Examiner—Nguyen T. Ha
(74) Attorney, Agent, or Firm—Sharon Upham

(57) ABSTRACT

A detector assembly including a support element, a first capacitor plate and a second capacitor plate. The support element is configured to attach the detector assembly to a chamber wall that separates a lower pressure region and a higher pressure region. A surface of the second capacitor plate is spaced apart from a surface of the first capacitor plate to define a capacitor gap. The first capacitor plate is positioned to be inside the lower pressure region when the detector assembly is attached to the chamber wall. The second capacitor plate is supported by the support element through insulating couplings. The detector assembly also includes a means for reducing mechanical load on the insulating couplings between the second capacitor plate and the support element. The reduced mechanical load includes load caused by a pressure difference between the lower and higher pressure regions.

15 Claims, 4 Drawing Sheets

DECREASING LOAD ON DEVICES FOR MASS SPECTROMETERS

BACKGROUND

The present invention relates to mass spectrometers.

A mass spectrometer analyzes mass-to-charge ratios of ions, such as charged atoms and molecules, and typically includes an ion source, one or more mass analyzers and one or more detectors. In the ion source, particles are ionized and extracted from a sample. The ions are transported to one or more mass analyzers that separate the ions based on their mass-to-charge ratio. The mass analyzers can include one or more quadrupolar analyzers, ion traps, time-of flight, magnetic, electromagnetic, ion cyclotron resonance or Fourier transform mass analyzers. The separated ions are detected by one or more detectors that provide data that is used to construct a mass spectrum of the sample.

The ions can be guided, trapped, and analyzed inside a vacuum chamber by devices such as multipole ion guides or linear or 3D-ion traps. For example, in multipole rod assemblies, such as quadrupole, hexapole, octapole or greater assemblies including four, six, eight, or more multipole rods, respectively, the multipole rods are arranged to define an interior volume, in which multipole electric potentials can be generated by applying an oscillating radio frequency ("RF") voltage on the multipole rods. The multipole electric potentials can guide or trap in the interior volume ions that have mass-to-charge ratios within a specific range that can be selected by the applied RF voltage and, optionally, with a DC bias applied to the multipole rods in the assembly.

Accuracy of the measured mass spectra depends, among other things, on how accurately the actual voltages of the multipole rods can be controlled during operation. To provide such control, the actual voltages can be measured by detector capacitors coupled to the multipole rods. The detector capacitors can provide feedback to a control circuit controlling the RF or DC voltages that are applied to the rods. Based on the feedback, the control circuit can ensure that the actual voltages applied to the multipole rods during operation match the desired RF or DC voltages.

To increase thermal stability, detector capacitors are typically made from materials of low thermal expansion coefficient, such as invar (composition 36% Ni balance iron), quartz or alumina. In addition, parts of the detector can be designed such that any dimensional changes that result from thermal expansion or contraction act to cancel each other to maintain the desired capacitance.

Typically, detector capacitors operate at atmospheric pressure. In one device, a detector capacitor is mounted on a wall that separates a low pressure region inside a vacuum chamber from the atmospheric pressure outside the chamber. In such detectors, the capacitor's gap is inside the low pressure region, and one of the capacitor plates separates the low pressure inside the vacuum chamber from the atmospheric pressure. Such detectors are discussed in more detail in U.S. Pat. No. 6,424,515 to Gore et al., the entire disclosure of which is incorporated by reference herein in its entirety.

SUMMARY

In a device, such as a detector capacitor, that is mounted in a mass spectrometer, mechanical load is reduced on couplings that hold in position one or more elements of the device, for example, a capacitor plate of the detector capacitor, such that movements of the elements are within a predetermined tolerance. The mechanical load may be caused by a pressure difference between a higher pressure region (e.g., at atmospheric pressure) and a lower pressure region (e.g., inside a vacuum chamber), or by distortions of a circuit board that is coupled to the detector capacitor. In general, in one aspect, the invention provides a detector assembly. The detector assembly includes a support element, a first capacitor plate and a second capacitor plate. The support element is configured to attach the detector assembly to a chamber wall that separates a lower pressure region and a higher pressure region. A surface of the second capacitor plate is spaced apart from a surface of the first capacitor plate to define a capacitor gap. The first capacitor plate is positioned to be inside the lower pressure region when the detector assembly is attached to the chamber wall. The second capacitor plate is supported by the support element through insulating couplings. The detector assembly also includes a means for reducing mechanical load on the insulating couplings between the second capacitor plate and the support element. The reduced mechanical load includes load caused by a pressure difference between the lower and higher pressure regions.

Particular implementations can include one or more of the following features. The means for reducing the mechanical load can be configured to couple the second capacitor plate and a circuit board. The second capacitor plate can be configured to receive a fastener to attach the circuit board to the detector assembly, and the means for reducing the mechanical load can be configured to couple the fastener and the circuit board and reduce a load caused by the circuit board. The second capacitor plate can include a post to receive the fastener. The second capacitor plate can be positioned to separate the lower and higher pressure regions such that a pressure difference between the pressure regions causes a load on the second capacitor plate, and the means for reducing the mechanical load can be configured to apply a counter-load through the fastener to the second capacitor plate to compensate the load caused by the pressure difference between the lower and higher pressure regions. The fastener can be adjustable to select the counter-load applied to the second capacitor plate. The means for reducing the mechanical load can be attached to the support element and positioned to separate the lower and higher pressure regions such that the second capacitor plate is entirely inside the lower pressure region. The means for reducing the mechanical load can be configured to provide an electrical coupling path from the second capacitor plate to a circuit detecting voltage of the second capacitor plate. The lower pressure region can include substantially a vacuum and the higher pressure region can have substantially atmospheric pressure. The detector assembly can include a conductor to connect the first capacitor plate to a multipole rod assembly inside the lower pressure region.

In general, in another aspect, the invention provides a detector assembly including a support element configured to attach the detector assembly to a chamber wall that separates a lower pressure region and a higher pressure region, a first capacitor plate positioned to be inside the lower pressure region when the detector assembly is attached to the chamber wall, and a second capacitor plate that has a surface spaced apart from a surface of the first capacitor plate to define a capacitor gap. The second capacitor plate is attached to the support element and positioned to separate the lower and higher pressure regions. The second capacitor plate is configured to receive a fastener to attach a circuit board to the detector assembly. The detector assembly also includes a flexible coupling element to couple the fastener and the circuit board.

Particular implementations can include one or more of the following features. The flexible coupling element can be a spring or a flexible washer. The flexible coupling element can include spaced apart fingers extending from a peripheral flange towards the interior of a region defined by the flange. The flexible coupling element can be configured to provide an electrical coupling path between the circuit board and the second capacitor plate.

In general in another aspect, the invention provides a detector assembly including a support element configured to attach the detector assembly to a wall separating a lower pressure region and a higher pressure region in a mass spectrometer. The detector assembly includes a first capacitor plate and a second capacitor plate that has a surface spaced apart from a surface of the first capacitor plate to define a capacitor gap. The first capacitor plate is positioned to be inside the lower pressure region. The second capacitor plate is supported by the support element. The detector assembly also includes a sealing element attached to the support element and positioned to separate the lower and higher pressure regions such that the second capacitor plate is entirely inside the lower pressure region.

Particular implementations can include one or more of the following features. The second capacitor plate and the sealing element can define an enclosure, and the assembly can include one or more pressure channels to equalize a pressure inside the enclosure and the lower pressure region. The sealing element can include a metal portion to provide an electrical coupling path from the second capacitor plate to a circuit detecting a voltage of the second capacitor plate. The sealing element can be configured to receive a fastener to attach a circuit board to the detector assembly.

In general in another aspect, the invention provides an assembly including a support element and a part attached to the support element. The support element is configured to attach to a wall that separates a lower pressure region and a higher pressure region. The part is positioned to separate the lower and higher pressure regions, and configured to attach a circuit board to the assembly. The assembly also includes a flexible coupling element to couple the part and the circuit board.

Particular implementations can include one or more of the following features. The assembly can include a fastener coupled to the part, where the flexible coupling element couples the part and the circuit board through the fastener. The part can be a part of a detector, pusher or reflectron of a time of flight mass analyzer.

In general in another aspect, the invention provides an assembly including a circuit board, a component, and one or more flexible coupling elements attaching the component to the circuit board such that the flexible coupling elements decrease strain on the component that is caused by deformations of the circuit board. In a particular implementation, the component can include a metal film resistor.

The invention can be implemented to realize one or more of the following advantages. Mechanical load can be reduced on couplings that hold an element of a device in position. Thus, the load does not move the element relative to other elements in the device, and the device elements maintain their relative distance from each other with a high precision. For example, the device can be a detector capacitor in which the distance between capacitor plates is maintained with a high precision by reducing mechanical load on the capacitor plates. This stabilizes the capacitance of the detector and makes high precision measurements possible. Reducing the mechanical load can limit relative displacements of the capacitor plates to be less than about one ten-thousandth ($10^{-4}$), one millionth ($10^{-6}$), or even less than about one ten-millionth ($10^{-7}$) of the distance between the plates. Mechanical loads that can be reduced include loads that are caused by a pressure difference between higher and lower pressure regions, such as between atmospheric pressure and low pressure inside a vacuum chamber, or mechanical loads that are caused by the deformation of a component, such as a circuit board, that is attached to the element due to heat, mechanical faults or distortions. For example, a circuit board can have a small bend, or a planar board can bow due to heat or mechanical forces. The load can be substantially reduced, for example by a factor of ten or more, on a capacitor plate by a flexible coupling element and a fastener that is attached to the capacitor plate. The fastener can be set to counter-act the load caused on the capacitor plate by the difference between the atmospheric pressure and the low pressure inside the vacuum chamber. The flexible coupling element can be a spring, a flexible washer or a specially designed coupling element that allows a large working range for adjusting the fastener to select a counter-load on the capacitor plate. The working range for selecting the counter-load can provide sufficient resolution to counteract the load caused by the pressure difference with a high precision. The flexible coupling element can also compensate for displacements caused by distortions of the board without transmitting mechanical load to the capacitor plate and the couplings holding the plate. The flexible coupling element can be made of a metal so the coupling element can provide an electrical coupling path to the capacitor plate. The electrical coupling path can also be provided by a separate conductor. In alternative implementations, the load can be reduced on the couplings of a capacitor plate by a sealing element that separates the atmospheric pressure region from the capacitor plate. Thus, the capacitor plate can be entirely inside the low pressure region so that there is no pressure difference that must be compensated for by the couplings that hold the capacitor plate. The sealing element can include metal portions to provide an electrical coupling path to the capacitor plate.

The details of one or more implementations of the invention are set forth in the accompanying drawings and the description below. Unless otherwise noted, the terms "include", "includes" and "including", and "comprise", "comprises" and "comprising" are used in an open-ended sense—that is, to indicate that the "included" or "comprised" subject matter is a part or component of a larger aggregate or group, without excluding the presence of other parts or components of the aggregate or group. Other features and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
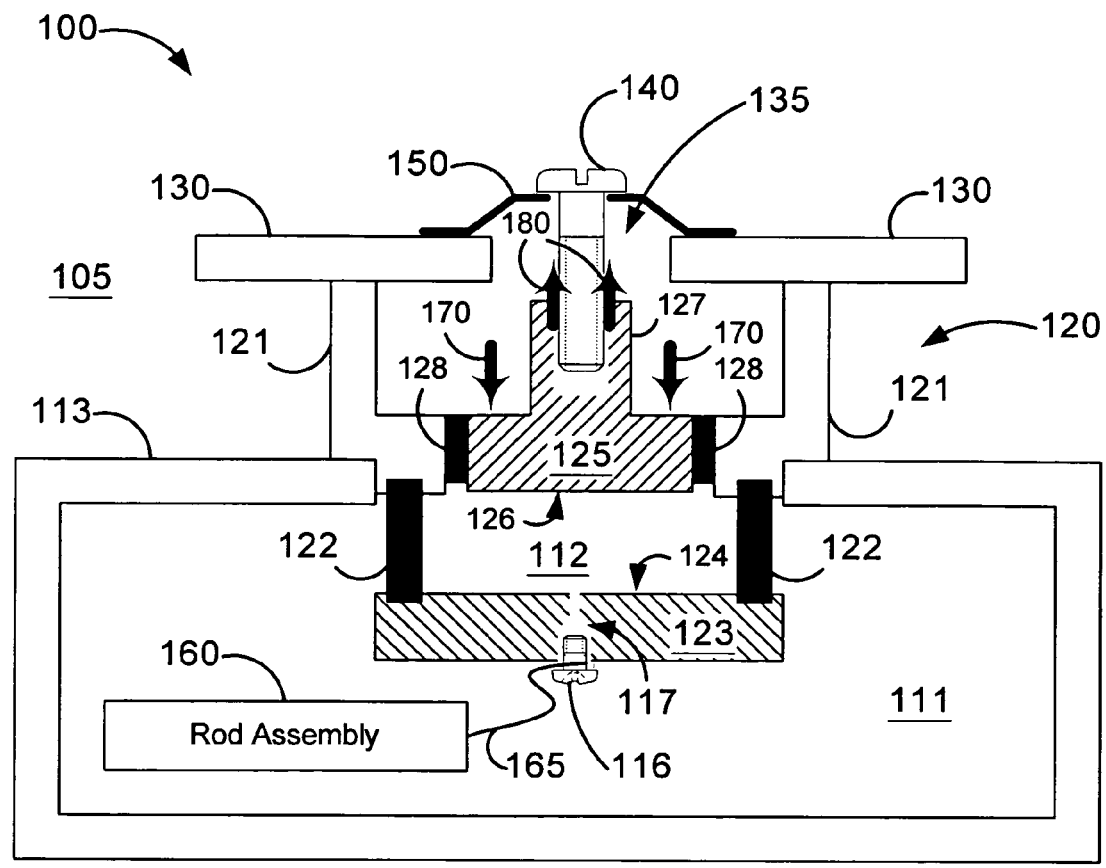
FIGS. 1A and 1B are schematic diagrams illustrating a detector capacitor according to one aspect of the invention.

FIG. 1A illustrates a cross section of a system 100 for a mass spectrometer. The system 100 includes a vacuum chamber 110, a detector capacitor 120 and a circuit board 130. The circuit board 130 is attached to the detector capacitor 120 using a fastener 140 and a flexible coupling element 150. Inside the vacuum chamber 110, a multipole rod assembly 160 is operated to perform mass spectroscopy. The detector capacitor 120 is electrically coupled to a multipole rod in the assembly 160 to detect a voltage of the multipole rod. The detected voltage can be processed by a circuit on the circuit board 130 to control the operation of multipole rod assembly 160.

The vacuum chamber 110 has a wall 113 that separates a lower pressure region 111 inside the vacuum chamber 110 from a higher pressure region 105 outside the vacuum chamber 110. Each pressure region is characterized by a substantially uniform pressure value inside the pressure region. Typically, the lower pressure region 111 is substantially a vacuum characterized by a small pressure value, such as $10^{-5}$ torr. The higher pressure region 105 is typically at atmospheric pressure.

The vacuum chamber wall 113 includes an aperture configured to receive the detector capacitor 120. The detector capacitor 120 includes a support element 121, a first capacitor plate 123 and a second capacitor plate 125. In one implementation, the support element 121 has a cylindrical shape. At one end, the support element 121 has a fitting portion that has a reduced outer diameter and defines a shoulder on the support element 121. When the support element 121 is mounted in vacuum chamber 110, the fitting portion can extend into the aperture in the wall 113 such that the shoulder of the support element 121 is placed against the vacuum chamber wall 113. The support element 121 can be mounted on the vacuum chamber wall 113, either directly or indirectly, and vacuum sealed using known techniques. For example, the support element 121 can be mounted using brackets and screws (not shown) and vacuum sealed with one or more flexible o-rings (not shown) placed between the vacuum chamber wall 113 and the shoulder of the support element 121. The support element 121 can be electrically grounded (or coupled to a source of constant voltage) to shield external electric fields during operation.

The first capacitor plate 123 is attached to the support element 121 by a standoff insulating sleeve 122. The insulating sleeve 122 can be made of ceramic, quartz, fused silica or other insulating material. The ends of the sleeve 122 are secured to the first capacitor plate 123 and support element 121, for example, by brazing or adhering with an adhesive, such as a two-part epoxy with or without a dielectric powder filling. The sleeve 122 spaces apart a surface 124 of the first capacitor plate 123 from a surface 126 of the second capacitor plate 125 to define a capacitor gap 112 of the detector capacitor 120.

The surfaces 124 and 126 of the first 123 and second 125 capacitor plates, respectively, can take any appropriate form, such as, for example, flat or curved surfaces, and can include a multi-part surface structure. Thus, for example, the first 123 capacitor plate or the second 125 capacitor plate can include a thin portion defining the surface 124 or 126, respectively, and a pole or other structure attached to the thin portion. Alternatively, the surface 124 or 126 can be defined by a thick monolithic capacitor plate.

The first capacitor plate 123 includes a through hole 117 that connects the capacitor gap 112 to the lower pressure region 111 such that the pressure is substantially the same inside the capacitor gap 112 and inside the vacuum chamber 110. In alternative implementations, the capacitor gap 112 can be connected to the lower pressure region 111 through a slot formed, for example, at either end of the insulating sleeve 122. Because the capacitor gap is inside the lower pressure region 111, which is typically a vacuum, the first 123 and second 125 capacitor plates can be positioned closer to each other than if the capacitor plates were in a higher (e.g., atmospheric) pressure environment. Thus the size of the detector capacitor 120 can be decreased, because electric discharges that may occur through the gas creating the atmospheric pressure can be avoided if the capacitor gap 112 is in a vacuum.

The first capacitor plate 123 is electrically coupled to a multipole rod in the assembly 160 by a wire 165 or by any other electrical coupling means. In one implementation, the through hole 117 has a threaded portion configured to receive a vented screw 116 that can be used to attach the wire 165 to the first capacitor plate 123. The wire 165 ensures that the first capacitor plate 123 has the same voltage as the multipole rod in the assembly 160. The voltage of the first capacitor plate 123 can be detected by the current flowing through the second capacitor plate 125. The detected current depends on a capacitive distance between the surfaces 124 and 126 of the first 123 and second 125 capacitor plates, respectively. High quality measurements can be performed with the detector capacitor 120 if the capacitive distance is maintained during operation with high precision. For example, relative changes that are about one millionth or more (such as about one ten-thousandth) of the capacitive distance may affect the voltage detected by the detector capacitor 120. The accuracy of the voltage detection affects how accurately the actual voltages of the multipole rods can be controlled during operation of the mass spectrometer.

The second capacitor plate 125 is attached to the support element 121 by couplings 128. The couplings 128 hold the second capacitor plate 125 in position, and seal the lower pressure region 111 in the capacitor gap 112 from the higher pressure region 105 outside the vacuum chamber 110. In one implementation, the couplings 128 include an isolating sleeve that is secured to the second capacitor plate 125 and the support element 121 by adhesive or brazing. Alternatively, the couplings 128 are formed without the isolating sleeve, using only an electrically insulating and vacuum sealing adhesive, such as a two-part epoxy with or without a dielectric powder filling.

The second capacitor plate 125 separates the lower 111 and higher 105 pressure regions. Thus, a pressure difference between the lower 111 and higher 105 pressure regions puts a load 170 on the second capacitor plate 125, which transmits the load 170 onto the couplings 128. The load 170 changes with the pressure difference. Typically, the couplings 128 may yield slightly to the load 170 by changing the position of the capacitor plate 125. For a pressure difference of about one atmosphere, the position of the capacitor plate 125 may move in the order of nanometers or more. For a typical capacitive distance, which is in the order of millimeters between the first and second capacitor plates, this motion may be more than can be tolerated for the desired precision of the detector capacitor 120. Typically, the capacitance between the first and second capacitor plates (and the corresponding measured voltage) changes in proportion to the relative change of the capacitive distance. Thus, through the load 170, the measured voltage may depend on the pressure difference between the lower 111 and higher 105 pressure regions.

The second capacitor plate 125 includes a post 127 that receives the fastener 140, such as a screw. The post 127 can be shorter or longer than indicated by FIG. 1A. In one implementation, the second capacitor plate 125 can directly receive the fastener 140 without a post or other additional structure. The fastener 140 is positioned through an aperture 135 in the circuit board 130 and couples the second capacitor plate 125 through the flexible coupling element 150 to the circuit board 130.

The flexible coupling element 150 can be configured to put a counter-load 180 on the second capacitor plate 125 through the fastener 140. That is, the coupling element 150 can pull the second capacitor plate 125 through the fastener 140 in a direction opposite to the load 170 caused by the pressure difference. Thus, the couplings 128 hold only a difference load that is a difference between the load 170 caused by the pressure difference and the counter-load 180 caused by the flexible coupling element 150. That is, the flexible coupling element 150 reduces load on the couplings 128 that hold the second capacitor plate 125 in position. The smaller the load on the couplings 128, the less that load can displace the second capacitor plate 125.

In one implementation, the fastener 140 can be adjusted to select the counter-load 180 such that the difference load on the couplings 128 is substantially zero. The precision of the adjustment depends on a workable range of the flexible coupling element 150, that is, a range of flexible deformations for which the counter-load 180 changes smoothly with the deformation. Thus, the counter-load 180 can be easily selected by adjusting the fastener 140 to compensate the load 170 caused by the pressure difference. In alternative implementations, the fastener 140 can provide a non-adjustable coupling, and the counter-load 180 has a fixed value. For example, the fixed value of the counter-load 180 can be selected to compensate a typical value of the load 170.

The flexible coupling element 150 can also absorb load that is caused by deformations of the circuit board 130. The circuit board 130 may be deformed due to heat or mechanical loads, such as loads resulting from contacts of the circuit board 130 with the support element 121 of the detector capacitor 120. These deformations can put a load on the flexible coupling element 150. Being flexible, the coupling element 150 can yield to such loads without transmitting the loads to the fastener 140 and eventually the second capacitor plate 125.

The flexible coupling element 150 can provide an electrical coupling path between the second capacitor plate 125 and circuit elements on the circuit board 130. For example, the coupling element 150 can be made of metal, such as copper, or a metal composition, such as beryllium copper. Alternatively, the electrical coupling path can be provided by a wire attached to the second capacitor plate 125 or the fastener 140.

Figure 1B:
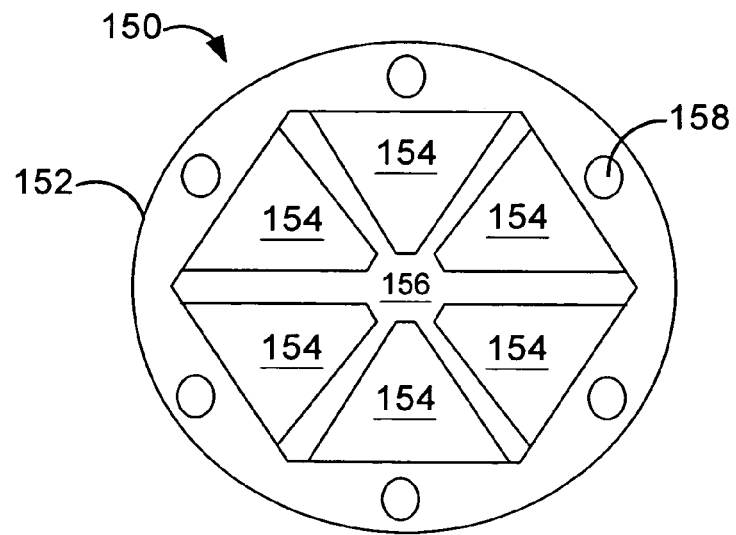

FIG. 1B illustrates a top view of the flexible coupling element 150. The coupling element 150 includes a peripheral flange 152 and multiple fingers 154. The peripheral flange 152 is a substantially planar object that has a circular, a polygonal or some other shape. The peripheral flange 152 can include one or more apertures 158 to attach the coupling element 150 to the circuit board 130 with fasteners, such as screws or solder. These fasteners can be made of metal or other electrically conductive material to provide an electrical coupling path between circuit elements of the board 130 and the second capacitor plate 125, as shown in FIG. 1A. The peripheral flange 152 can be attached to the top surface of the circuit board 130 as shown in FIG. 1A. Alternatively, the peripheral flange 152 can be attached to the bottom surface of the circuit board 130 with fasteners, such as screws or solder.

Each of the fingers 154 has a base attached to the flange 152, and points from the flange 152 to a center 156 of the shape of the flange 152. The fingers 154 can be wider at the base than near the center 156. The fingers 154 point out of the plane of the flange 152 (as shown in FIG. 1A) and define an aperture for the fastener 140 about the center 156. When the head of the fastener 140 presses against the fingers 154, the fingers 154 can flexibly bend to provide a counter-load on the fastener 140.

Figure 2A:
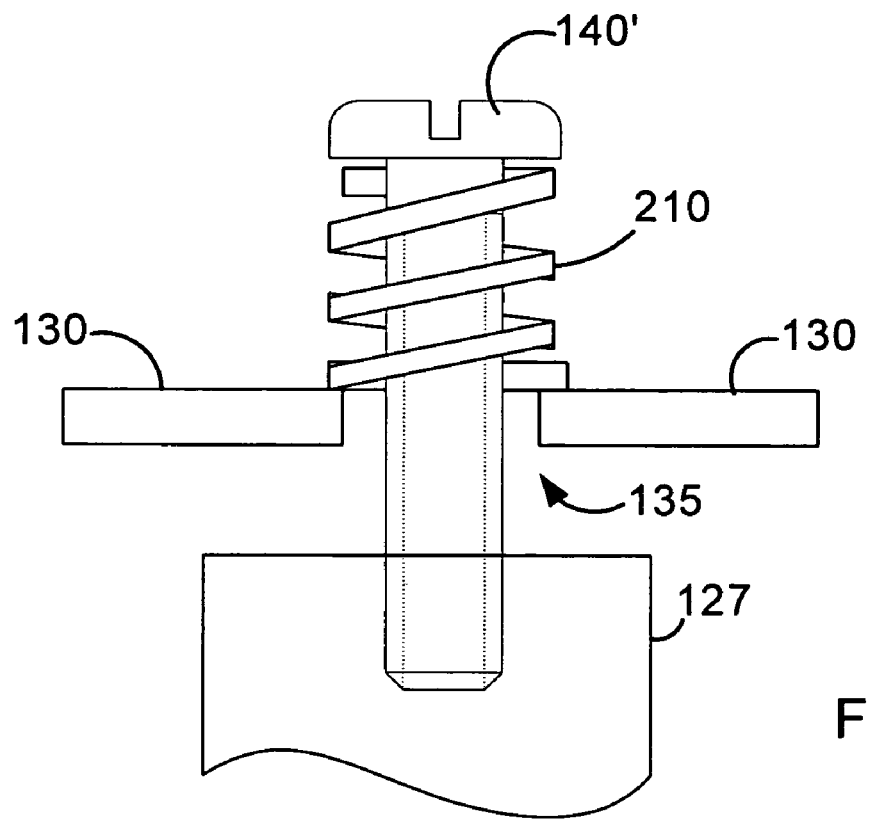
FIGS. 2A and 2B are schematic diagrams illustrating exemplary implementations of a flexible coupling element.
Figure 2B:
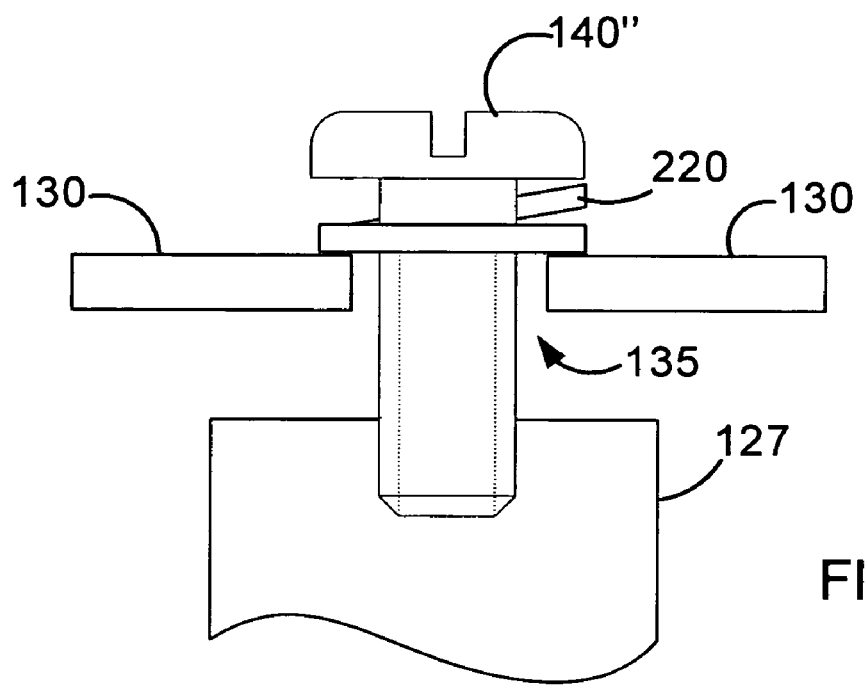

FIGS. 2A and 2B illustrate alternative implementations for the flexible coupling element 150 shown in FIGS. 1A and 1B. FIGS. 2A and 2B illustrate the circuit board 130 with the aperture 135 and the post 127 of the second capacitor plate 125.

FIG. 2A illustrates a cross sectional view of a helical spring 210. The helical spring 210 is positioned between the circuit board 130 and a fastener 140' to attach the circuit board 130 to the post 127 of the second capacitor plate 125. When pressed, the helical spring 210 puts a counter-load on the fastener 140' to compensate the load 170 on the second capacitor plate 125. The fastener 140' can be a screw that can be turned to adjust the counter-load. Length and flexibility of the helical spring 210 can be selected to provide a working range that is appropriate to adjust the counter-load for typical pressure differences. The helical spring 210 can be made of metal, and press against an electric contact on the circuit board 130 to provide an electrical coupling path to the second capacitor plate 125.

FIG. 2B illustrates a cross sectional view of a flexible washer 220 that is positioned between the circuit board 130 and a fastener 140" to attach the circuit board 130 to the post 127 of the second capacitor plate 125. When the fastener 140" is tightened, the flexible washer 220 puts a counter-load on the fastener 140" to compensate the load 170 on the second capacitor plate 125. The fastener 140" can be a screw that can be turned to adjust the counter-load. Typically, the flexible washer 220 provides a smaller working range for adjusting the counter-load than the spring 210. The flexible washer 220 can be made of metal and press against an electric contact on the circuit board 130 to provide an electrical coupling path to the second capacitor plate 125.

Figure 3A:
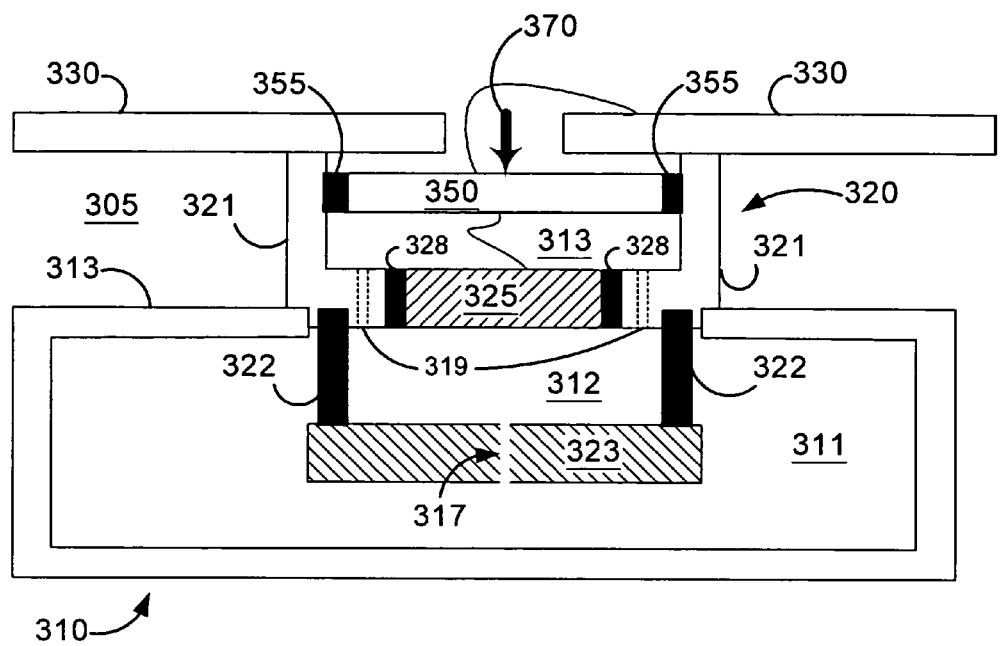
FIGS. 3A and 3B are schematic diagrams illustrating a detector capacitor according to another aspect of the invention.
Figure 3B:
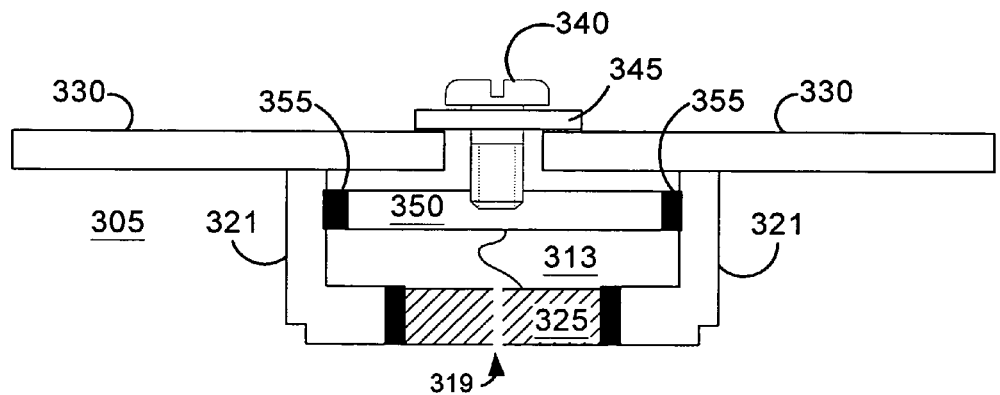

FIGS. 3A and 3B illustrate a detector capacitor 320 according to one aspect of the invention. A circuit board 330 is attached to the detector capacitor 320, which is mounted in an aperture in a wall 313 of a vacuum chamber 310. The vacuum chamber wall 313 separates a lower pressure region 311, such as a vacuum, inside the vacuum chamber 310 from a higher pressure region 305, such as atmospheric pressure, outside the vacuum chamber 310.

The detector capacitor 320 includes a support element 321, a first capacitor plate 323 is and a second capacitor plate 325. The support element 321 is mounted on the vacuum chamber wall 313 and vacuum sealed using known techniques. The first capacitor plate 323 is attached to the support element 321 by a standoff insulating sleeve 322, which spaces apart the first capacitor plate 323 from the second capacitor plate 325 to define a capacitor gap 312 of the detector capacitor 320. The first capacitor plate 323 includes a through hole 317 (or the insulating sleeve 322 includes a slot) that connects the capacitor gap 312 to the lower pressure region 311 such that the pressure is substantially the same inside the capacitor gap 312 and inside the vacuum chamber 310.

The second capacitor plate 325 is attached to the support element 321 by couplings 328 that hold the second capacitor plate 325 in position and electrically insulate it from the support element 321, for example, by an isolating sleeve that is secured to the second capacitor plate 325 and the support element 321 by adhesive or brazing.

A sealing element 350 defines an enclosure 313 with the second capacitor plate 325 and the support element 321. The enclosure 313 is in the lower pressure region 311 and the sealing element 350 separates the higher 305 and lower 311 pressure regions. In one implementation, the support element 321 includes one or more pressure channels 319 that connect the capacitor gap 312, which has a pressure of the lower pressure region 311, to the enclosure 313. The pressure channels 319 ensure that the pressure is substantially the same in the capacitor gap 312 and the enclosure 313. The pressure channels 319 can include one or more through holes in the support element 321, as shown in FIG. 3A. Alternatively, the pressure channels 319 can be implemented as one or more through holes in the second capacitor plate 325, as shown in FIG. 3B. Because the pressure is substantially the same in the capacitor gap 312 and the enclosure 313, i.e., on two sides of the second capacitor plate 325, there is no pressure difference that would cause a load on the couplings 328 that hold the second capacitor plate 325. Thus, the position of the second capacitor plate 325 can be maintained with high precision with respect to the first capacitor plate 323.

The sealing element 350 is attached to the support element 321 by vacuum seals 355. The vacuum seals 355 support the sealing element 350, and separate the lower pressure region 311 from the higher pressure region 305. Thus, there is a load 370 on the sealing element 350, and accordingly on the vacuum seals 355, if the lower 311 and higher 305 pressure regions have different pressures. Because there is no mechanical coupling between the sealing element 350 and the second capacitor plate 325, the load 370 is not transmitted to the second capacitor plate 325. That is, the sealing element 350 reduces the load on the second capacitor plate 325.

The sealing element 350 can include one or more metal portions that are electrically insulated from the support element 321. For example, the entire sealing element 350 can be made of metal and the vacuum seals 355 can provide the electrical insulation from the support element. The metal portions can be connected by wires to the second capacitor plate 325, on one side, and to the circuit board, on the other side, to provide an electrical coupling path to circuit elements of the circuit board 330.

FIG. 3B illustrates an alternative implementation, where the sealing element 350 is configured to receive a fastener 340, such as a screw. The fastener 340 attaches the sealing element 350 to the circuit board 330 through a washer 345, which can be either flexible or non-flexible, because loads on the sealing element, and its corresponding displacements, do not affect the capacitor plates. The fastener 340 and the washer 345 can be made of metal or other electrically conductive material to provide an electrical coupling path between the second capacitor plate 325 and circuit elements on the circuit board 330.

Figure 4:
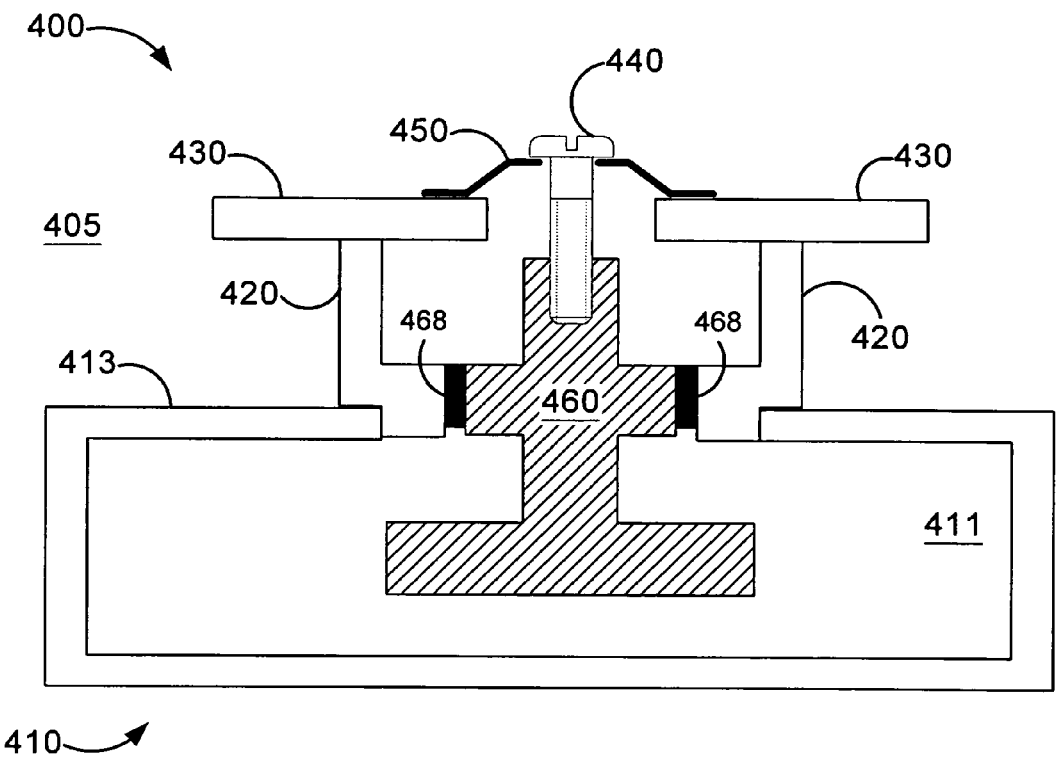
FIG. 4 is a schematic diagram illustrating a device mounted on a vacuum chamber wall according to yet another aspect of the invention.

FIG. 4 illustrates a cross section of a system 400 for a mass spectrometer. The system 400 includes a vacuum chamber 410, a support element 420 supporting a part 460 and a circuit board 430. The part 460 can be a part of a detector or any other electronic device of the mass spectrometer. For example, the part 460 can be a metal part of or attached to a pusher, a detector, or a reflectron of a time of flight mass analyzer.

The support element 420 is mounted in a hole in a wall 413 of the vacuum chamber 410. The wall 413 separates a lower pressure region 411 inside the vacuum chamber 410 from a higher pressure region 405 outside the vacuum chamber 410. For example, the lower pressure region 411 is a vacuum characterized by a small pressure value, such as $10^{-5}$ torr, and the higher pressure region 405 is at atmospheric pressure.

The part 460 is attached to the support element 420 by couplings 468 that are electrically insulating and vacuum sealing. For example, the couplings 468 can include adhesives, such as epoxy, and optionally an isolating sleeve. The couplings 468 hold the part 460 in position, and seal the lower pressure region 411 from the higher pressure region 405.

The part 460 separates the lower 411 and higher 405 pressure regions. Thus the couplings 468 may receive a load that depends on a pressure difference between the lower 411 and higher 405 pressure regions. As the load changes with the pressure difference, the couplings 468 may yield slightly to the load and change the position of the part 460.

The circuit board 430 is attached to the part 460 using a fastener 440 and a flexible coupling element 450. The flexible coupling element 450 can be a coupling element similar to any of the flexible coupling elements 150 (FIG. 1A and 1B), the helical spring 210 (FIG. 2A) and flexible washer 220 (FIG. 2B). The flexible coupling element 450 can put a counter-load on the part 460 to reduce the load on the couplings 468. The smaller the load on the couplings 468, the less that load can displace the part 460. The flexible coupling element 450 can also reduce a load that is caused by deformations of the circuit board 430. The flexible coupling element 450 and the fastener 440 can be made of a conductive material to provide an electronic path between a circuit element in the board 430 and the part 460.

Figure 5:
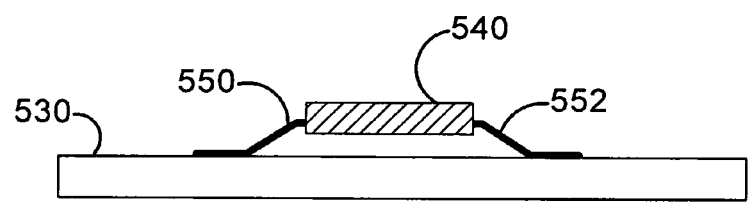
FIG. 5 is a schematic diagram illustrating flexible coupling elements for coupling an electronic element to a circuit board.

FIG. 5 illustrates a use of flexible coupling elements 550 and 552 for coupling a component 540 to a circuit board 530. The component 540 can be a metal film resistor or any other component that is sensitive to strain caused by mechanical load. The component 540 is attached to the circuit board 530 by the flexible coupling elements 550 and 552. For example, the flexible coupling elements 550 and 552 can be soldered to metal portions of the circuit board 530 and the component 540. In one implementation, each of the flexible coupling elements 550 and 552 is similar to a finger 154 of the flexible coupling element 150 (FIGS. 1A and 1B). In an alternative implementation, the component 540 can be rigidly attached to the circuit board 530 at one end, and flexibly attached by just a single flexible coupling element (e.g., 550) at the other end. In either implementation, the flexible coupling element or elements 550 and 552 can reduce the load that is caused by deformations of the circuit board 530. Thus, the component 540 is exposed to less strain and can operate with a higher precision.

The invention has been described in terms of particular embodiments. Other embodiments are within the scope of the following claims. For example, while some implementations of the invention are described as being mounted on a wall that separates an internal vacuum chamber of a mass spectrometer from an external region at atmospheric pressure, the invention can be implemented on devices mounted on internal as well as external walls. In addition, while implementations of the invention are illustrated in configurations in which a fastener such as a screw is used to attach the device (via a flexible coupling element) to a circuit board, the invention can be implemented to attach such components using soldered joints or other conventional techniques.

What is claimed is:

1. A detector assembly, comprising:
a support element configured to attach the detector assembly to a chamber wall that separates a lower pressure region and a higher pressure region;
a first capacitor plate and a second capacitor plate, a surface of the second capacitor plate being spaced apart from a surface of the first capacitor plate to define a capacitor gap, the first capacitor plate being positioned to be inside the lower pressure region when the detector assembly is attached to the chamber wall, the second capacitor plate being supported by the support element through insulating couplings; and
means for removing mechanical load from the insulating couplings between the second capacitor plate and the support element, the removed mechanical load including load caused by a pressure difference between the lower and higher pressure regions.

2. The detector assembly of claim 1, wherein:
the means for removing the mechanical load is configured to connect the second capacitor plate and the circuit board.

3. The detector assembly of claim 2, wherein:
the second capacitor plate is configured to receive a fastener to attach a circuit board to the detector assembly; and
the means for removing the mechanical load is configured to couple the fastener and the circuit board and reduce a load caused by the circuit board.

4. The detector assembly of claim 3, wherein:
the second capacitor plate includes a post to receive the fastener.

5. The detector assembly of claim 3, wherein:
the second capacitor plate is positioned to separate the lower and higher pressure regions such that a pressure difference between the pressure regions causes a load on the second capacitor plate; and
the means for removing the mechanical load is configured to apply a counter-load through the fastener to the second capacitor plate to compensate the load caused by the pressure difference between the lower and higher pressure regions.

6. The detector assembly of claim 5, wherein the fastener is adjustable to select the counter-load applied to the second capacitor plate.

7. The detector assembly of claim 1, wherein:
the means for removing the mechanical load is attached to the support element and positioned to separate the lower and higher pressure regions such that the second capacitor plate is entirely inside the lower pressure region.

8. The detector assembly of claim 1, wherein:
the means for removing the mechanical load is configured to provide an electrical coupling path from the second capacitor plate to a circuit detecting voltage of the second capacitor plate.

9. The detector assembly of claim 1, wherein the lower pressure region includes substantially a vacuum and the higher pressure region has substantially atmospheric pressure.

10. The detector assembly of claim 1, further comprising:
a conductor to connect the first capacitor plate to a multipole rod assembly inside the lower pressure region.

11. A detector assembly, comprising:
a support element configured to attach the detector assembly to a chamber wall that separates a lower pressure region and a higher pressure region;
a first capacitor plate positioned to be inside the lower pressure region when the detector assembly is attached to the vacuum chamber wall;
a second capacitor plate having a surface spaced apart from a surface of the first capacitor plate to define a capacitor gap, the second capacitor plate being attached to the support element and positioned to separate the lower and higher pressure regions and being configured to receive a fastener to attach a circuit board to the detector assembly; and
a flexible coupling element to connect the fastener and the circuit board.

12. The detector assembly of claim 11, wherein the flexible coupling element is a spring.

13. The detector assembly of claim 11, wherein the flexible coupling element is a flexible washer.

14. The detector assembly of claim 11, wherein the flexible coupling element includes spaced apart fingers extending from a peripheral flange towards the interior of a region defined by the flange.

15. The detector assembly of claim 11, wherein the flexible coupling element is configured to provide an electrical coupling path between the circuit board and the second capacitor plate.

* * * * *